United States Patent [19]

Thomas et al.

[11] Patent Number: 5,312,264
[45] Date of Patent: May 17, 1994

[54] ARTICLE LOCATING AND CENTERING MEANS

[75] Inventors: Ronald E. Thomas; K. Troy Alwine, both of Warren, Pa.

[73] Assignee: GTE Products Corp., Danvers, Mass.

[21] Appl. No.: 787,359

[22] Filed: Nov. 4, 1991

[51] Int. Cl.$^5$ ............................................. H01R 13/73
[52] U.S. Cl. .................................. 439/247; 439/571; 248/220.4
[58] Field of Search ............... 439/247, 248, 567, 571, 439/554, 557, 558; 248/220.3, 220.4

[56] References Cited

U.S. PATENT DOCUMENTS

| | | | |
|---|---|---|---|
| 3,861,779 | 1/1975 | Pfeifer | 439/679 |
| 4,173,387 | 11/1979 | Zell | 439/557 |
| 4,664,458 | 5/1987 | Worth | 439/248 |
| 5,171,165 | 12/1992 | Hwang | 439/567 |

OTHER PUBLICATIONS

IBM Technical Disclosure Bulletin, vol. 26, No. 4, Sep. 1983, "Securing Printed Circuit Cables".
IBM Technical Disclosure Bulletin, vol. 33, No. 4, Sep. 1990, "Printed Circuit Board and Component Keying and Retention Design".

Primary Examiner—Gary F. Paumen
Attorney, Agent, or Firm—William H. McNeill

[57] ABSTRACT

An article such, as an electrical connector, for mounting upon a substrate, such as a printed circuit board. The article includes a mounting plane having locating and centering means thereon. The locating and centering means comprises first and second spaced apart, depending lugs, each of which tapers from a first diameter proximal the mounting plane to a second diameter, narrower than the first diameter, distal said mounting plane. The first lug has a longitudinal slot extending its length in a given direction and the second lug has a longitudinal slot extending its length in a direction orthogonal to the given direction. The slots extending in different directions provide a centering and holding response which fixes the connector in position so that subsequent operations may be performed.

4 Claims, 2 Drawing Sheets

ARTICLE LOCATING AND CENTERING MEANS

TECHNICAL FIELD

This invention relates to article locating and centering means. More particularly, it has applicability to locating and centering an electrical connector on a substrate, such as a printed circuit board.

BACKGROUND ART

Electrical connectors comprised of an electrically insulating housing containing a multiplicity of electrical contacts are well known. Such connectors may contain depending lugs for placing the connector in a suitable position on a substrate. An object of this invention is to imbue such lugs with a locating and centering function.

DISCLOSURE OP INVENTION

It is therefore, another object of this invention to provide an article, such as, for example, an electrical connector, with depending lugs which provide an orientation function, ensuring one-way mounting.

It is another object of the invention to provide such lugs with means for achieving a tight fit into a substrate, such as a printed circuit board, whereby movement during soldering of the contacts is prevented.

These objects are accomplished in one aspect of the invention, by the provision of an article for mounting upon a substrate, which article includes a mounting plane having locating and centering means thereon. The locating and centering means comprise first and second spaced apart, depending lugs. The first lug has a longitudinal slot extending its length in a given direction and the second lug has a longitudinal slot extending its length in a direction orthogonal to the given direction.

The orthogonal slots create a centering action forcing the lugs to the center of their respective mounting holes. Additionally, the lugs may be tapered, this tapering providing a tight fit preventing article movement during subsequent operations. When the article is an electrical connector, a subsequent operation can include soldering electrical contacts, contained within the connector, to a printed circuit board.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
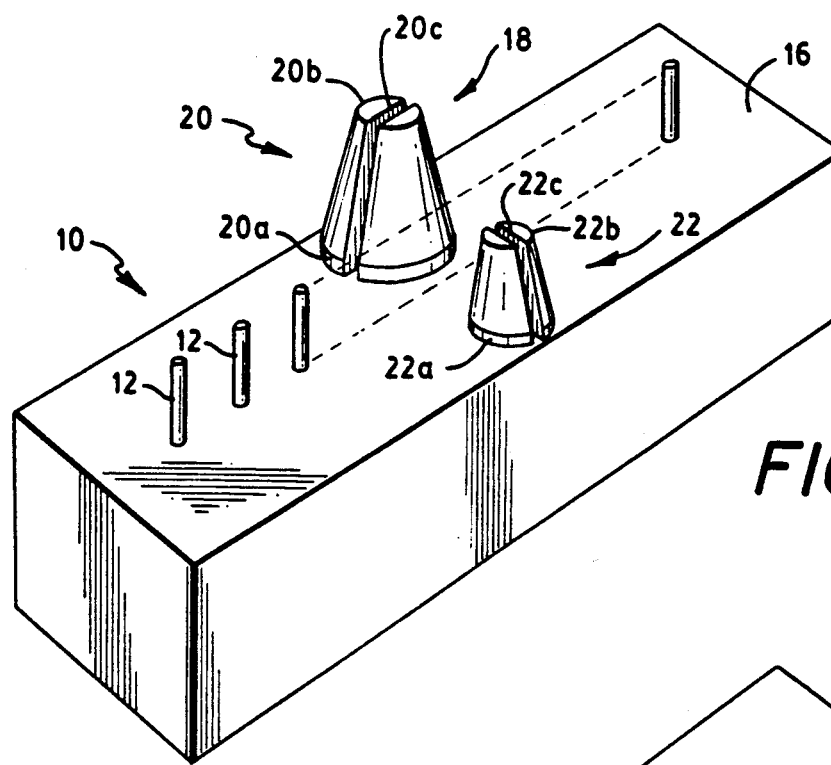
FIG. 1 is a diagrammatic, perspective view of an article utilizing an embodiment of the invention.

Referring now to the drawings with greater particularity, there is shown in FIG. 1 an article 10, which can be an electrical connector, containing a plurality of electrical contacts 12. The article 10 is formed for mounting upon a substrate 14, such as shown in FIG. 2, and which can be a printed circuit board or similar device.

The article 10 has a mounting plane 16, which in this instance is the base of the article. Locating and centering means 18 are provided on the mounting plane and in this embodiment comprise first and second, spaced apart, depending lugs 20 and 22, respectively. The first lug 20 tapers from a first diameter 20a, proximal to mounting plane 16, to a second, narrower diameter 20b, distal from mounting plane 16. The second lug 22 tapers from a first diameter 22a, proximal to mounting plane 16, to a second narrower diameter 22b, distal from mounting plane 16.

The first lug 20 has a longitudinal slot 20c extending its length in a given direction which, in this instance, is shown as being parallel to the long side of article 10, and the second lug 22 has longitudinal slot 22c extending its length in a direction orthogonal to the given direction. The lugs being slotted 180° from each other creates a centering action which forces the lugs to the center of their respective mounting holed. Such holes are shown, for example as 20d and 22d in substrate 14. When substrate 14 is a printed circuit board and article 10 is an electrical connector, additional holes 24 can be provided to receive contacts 12.

Figure 2:
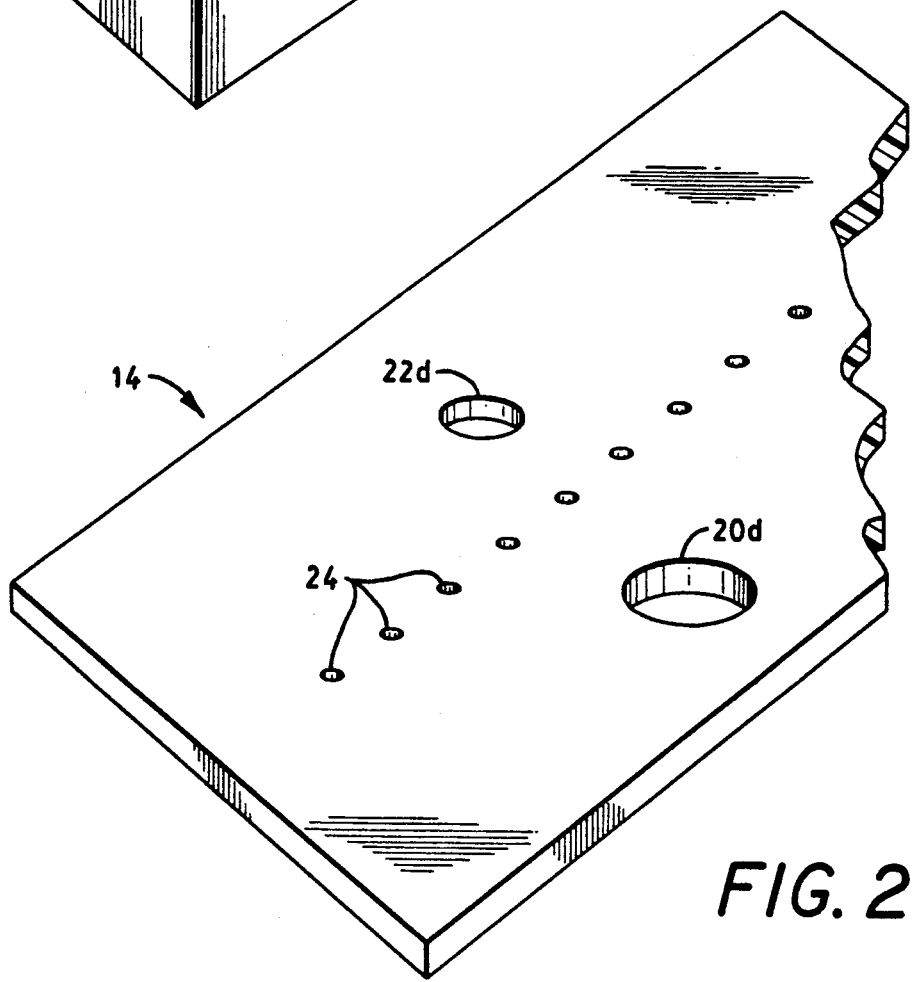
FIG. 2 is a perspective view of a substrate for use with an embodiment of the invention.
Figure 3:
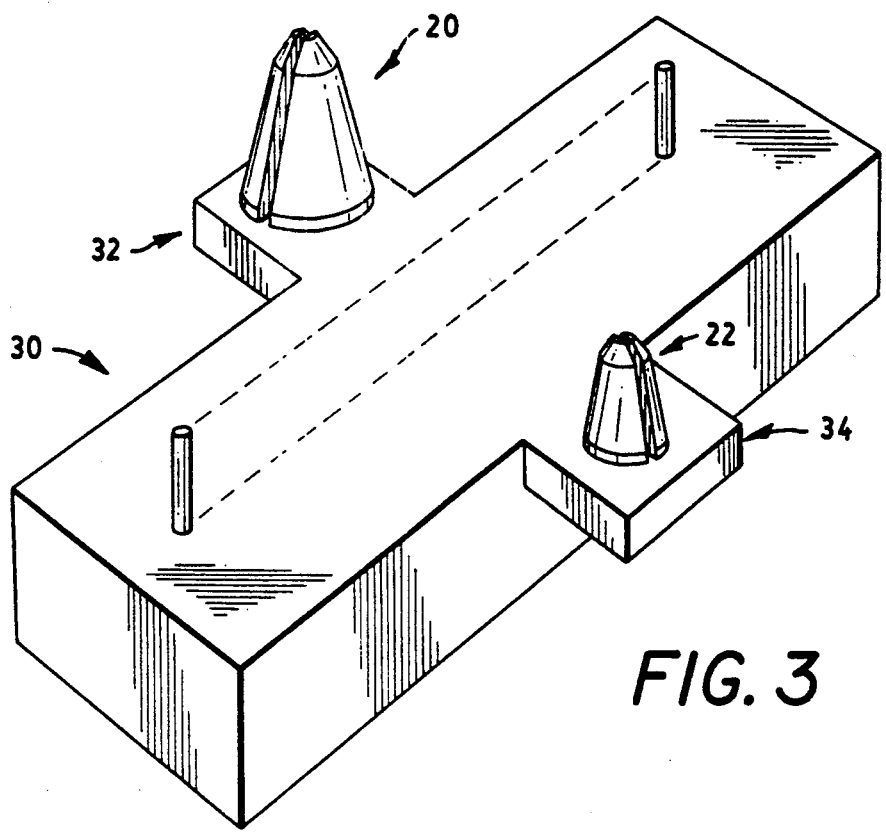
FIG. 3 is a perspective view of an alternate embodiment of the invention.

In a preferred embodiment of the invention the lugs 20 and 22 can be of different sizes, as shown in FIGS. 1 and 3, to match holed 20d and 22d as shown in FIG. 2, whereby an orientation function can be provided as well.

An alternate embodiment is shown in FIG. 3 wherein an article 30 has a wing 32, 34, extending from either side thereof and the lugs 20, 22, respectively, depend therefrom.

Figure 4:
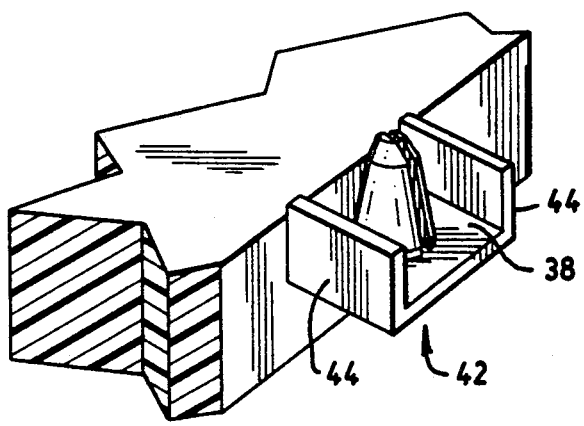
FIG. 4 is a partial perspective view of yet another embodiment of the invention.

In yet another alternate embodiment of the invention, as shown in FIG. 4, a mounting plane 38 is provided on a wing 42 that is positioned on a differnt plane than the base. In the latter instance, a wall 44 can be provided on two sides of the wing.

Utilizing the locating, centering and orientation features disclosed above provides a simple and inexpensive means of achieving such results.

While there have been shown and described what are at present considered to be the preferred embodiments of the invention, it will be apparent to those skilled in the art that various changes and modifications can be made herein without departing from the scope of the invention as defined by the appended claims.

What is claimed is:

1. An article for mounting upon a substrate, said article including a mounting plane having locating and centering means thereon, said locating and centering means comprising: first and second spaced apart, depending lugs, each of said lugs tapering from a first diameter proximal said mounting plane to a second diameter, narrower than said first diameter, distal said mounting plane; said first lug having a longitudinal slot extending its length in a given direction and said second lug having a longitudinal slot extending its length in a direction orthogonal to said given direction.

2. The article of claim 1 wherein said first and second diameters of said first lug are larger, respectively, than said first and second diameters of said second lug.

3. An assembly comprising: a substrate including at least first and second lug receiving apertures therethrough; and an article mounted theron, said article including a mounting plane having locating and centering means thereon, said locating and centering means comprising: first and second spaced apart, depending lugs, each of said lugs tapering from a first diameter proximal said mounting plane to a second diameter, narrower than said first diameter, distal said mounting plane; said first lug having a longitudinal slot extending its length in a given direction and said second lug having a longitudinal slot extending it length in a direction orthogonal to said given direction, said lugs engaging said apertures.

4. An article for mounting upon a substrate, said article including a mounting plane having locating and centering means thereon, said locating and centering means comprising: first and second spaced apart, depending lugs, each of said lugs continuously tapering from a first area abutting said mounting plane to a second area, smaller than said first area, distal said mounting plane; said first lug having a longitudinal slot extending substantially its entire length in a given direction and said second lug having a longitudinal slot extending substantially its entire length in a direction orthogonal to said given direction.

* * * * *